US009281463B2

(12) United States Patent
Greer et al.

(10) Patent No.: US 9,281,463 B2
(45) Date of Patent: Mar. 8, 2016

(54) ATOMIC LAYER DEPOSITION OF METAL-OXIDE TUNNEL BARRIERS USING OPTIMIZED OXIDANTS

(71) Applicant: Intermolecular Inc., San Jose, CA (US)

(72) Inventors: Frank Greer, Pasadena, CA (US); Andy Steinbach, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 221 days.

(21) Appl. No.: 14/138,656

(22) Filed: Dec. 23, 2013

(65) Prior Publication Data
US 2015/0179917 A1 Jun. 25, 2015

(51) Int. Cl.
H01L 39/24 (2006.01)

(52) U.S. Cl.
CPC .................................. *H01L 39/2493* (2013.01)

(58) Field of Classification Search
CPC ....................................... H01L 39/24–39/2493
See application file for complete search history.

(56) References Cited

U.S. PATENT DOCUMENTS

| 4,470,190 | A | * | 9/1984 | Fulton | ................. | H01L 39/2493 |
| | | | | | | 257/32 |
| 4,536,414 | A | * | 8/1985 | Kroger | ................. | H01L 39/2493 |
| | | | | | | 204/192.35 |
| 5,399,881 | A | | 3/1995 | Bozovic | | |
| 7,449,345 | B2 | | 11/2008 | Horng | | |
| 7,598,579 | B2 | | 10/2009 | Horng | | |
| 8,119,424 | B2 | | 2/2012 | Mather | | |
| 2013/0001668 | A1 | | 1/2013 | Frank | | |

OTHER PUBLICATIONS

Mikko Ritala et al.; Atomic Layer Deposition of Oxide Thin Films with Metal Alkoxides as Oxygen Sources; May 9, 2013; Science AAAS; Unknown.
Rongtao Lu et al.; Fabrication of NbAl2O3Nb Josephson Junctions Using in situ Magnetron Sputtering and Atomic Layer Deposition; Nov. 1, 2012; IEEE; Unknown.

* cited by examiner

Primary Examiner — Colleen Dunn

(57) ABSTRACT

Metal oxide tunnel barrier layers for superconducting tunnel junctions are formed by atomic layer deposition. Both precursors include a metal (which may be the same metal or may be different). The first precursor is a metal alkoxide with oxygen bonded to the metal, and the second precursor is an oxygen-free metal precursor with an alkyl-reactive ligand such as a halogen or methyl group. The alkyl-reactive ligand reacts with the alkyl group of the alkoxide, forming a detached by-product and leaving a metal oxide monolayer. The temperature is selected to promote the reaction without causing the metal alkoxide to self-decompose. The oxygen in the alkoxide precursor is bonded to a metal before entering the chamber and remains bonded throughout the reaction that forms the monolayer. Therefore, the oxygen used in this process has no opportunity to oxidize the underlying superconducting electrode.

20 Claims, 4 Drawing Sheets

ATOMIC LAYER DEPOSITION OF METAL-OXIDE TUNNEL BARRIERS USING OPTIMIZED OXIDANTS

BACKGROUND

Related fields include superconducting electronics, particularly Josephson junctions.

Superconductivity—zero resistance to direct electrical current and expulsion of magnetic fields—results from a phase transition that occurs in some materials at temperatures lower than a critical temperature. For many metals and alloys, the critical temperature is less than 20 degrees Kelvin; for some materials (e.g., high-temperature superconducting ceramics) the critical temperature is higher.

In a superconducting material, the electrons become paired ("Cooper pairs"), attracted very slightly to each other as a result of interactions with a surrounding ionic lattice that is distorted in proximity to the electrons. When paired, the electrons' energy state is lowered, forming a small (0.002 eV) energy gap around the Fermi level. The gap inhibits the electron/lattice collisions that manifest as normal electrical resistance, so that the electrons move through the ionic lattice without being scattered.

A Josephson junction is a thin layer of a non-superconducting material between two superconducting layers. Pairs of superconducting electrons can tunnel through the thin non-superconducting layer ("tunnel barrier") from one of the adjacent superconductors to the other. Types of Josephson junctions include S-I-S (superconductor, insulator, superconductor; also known as a superconducting tunnel junction, "STJ"), S-N-S (superconductor, non-superconducting metal, superconductor), or S-s-S (all-superconductor, with a superconductivity-weakening physical constriction in the middle section).

When a current is applied to a Josephson junction, the voltage across it is either zero (if the current I is below a critical current $I_c$) or an AC voltage with a frequency dependent on the magnitude of the voltage (if $|\geq I_c|$). Josephson junctions may be used as voltage-to-frequency converters because of this property. If a DC voltage is applied across a Josephson junction, the current oscillates with a frequency proportional to the voltage: $f=(2e/h)V$, where f is the frequency, e is the electron charge, h is Planck's constant, and V is the applied voltage). If a Josephson junction is irradiated with electromagnetic radiation of frequency $f_a$, (e.g., a microwave frequency), the Cooper pairs synchronize with $f_a$ and its harmonics, producing a DC voltage across the junction. STJs can be used as elements of quantum logic, rapid single flux quantum circuits, and single-electron transistors; as heterodyne mixers and superconducting switches such as quiterons; as magnetometers, e.g. superconducting quantum interference devices (SQUIDs); and as other sensors such as voltmeters, charge sensors, thermometers, bolometers and photon detectors. However, mass production of STJ-based devices has been challenging, in part because critical current and critical current density tends to vary among STJs formed on different parts of a substrate.

Cooper pairs merge into a condensate in velocity space, also called a collective quantum wave. If the insulator in an STJ is sufficiently thin, the wave can "spill out" of the superconductor and the electron pair can tunnel through the insulator, but excess thickness can prevent an STJ from functioning. Control of the thickness of the tunnel barrier is thus critical to STJ performance; it generally needs to be about 3 nm or less, and in some cases between 0.07 and 1.5 nm.

In addition, Cooper pairing is easily disrupted by defects such as grain boundaries and cracks, which can create Josephson weak links ("accidental" Josephson junctions). In a superconducting microwave circuit, the weak links cause nonlinearity in resistance and reactance, intermodulation of different microwave tones, and generation of unwanted harmonics. Control of defects, both in bulk materials and at interfaces, is therefore also critical.

Unwanted oxidation of the superconducting electrodes has been identified as a source of excess tunnel-barrier thickness (because the extra oxide adds to the intentionally formed tunnel barrier), defects, and non-uniformity of critical current and critical current density in STJs. Therefore, a need exists for fabrication methods that prevent or remove the unwanted electrode oxidation.

SUMMARY

The following summary presents some concepts in a simplified form as an introduction to the detailed description that follows. It does not necessarily identify key or critical elements and is not intended to reflect a scope of invention.

Methods of forming a metal-oxide tunnel barrier layer for an STJ may begin with removing any etchant residues and native oxides from a first superconducting layer (first electrode). The removal may involve argon (Ar) sputtering, hydrogen-radical (H*) or other plasma reduction, or wet cleaning. A dielectric layer (the tunnel barrier) is then formed over the first superconducting layer by atomic layer deposition (ALD).

The ALD includes alternating pulses of a metal alkoxide precursor and an oxygen-free metal precursor. Between the pulses, the chamber may be purged. The oxygen-free metal precursor includes an alkyl-reactive ligand such as a halogen or a methyl group. The oxygen in the alkoxide precursor remains bonded to the metal throughout the ALD reaction, so that it is never free to oxidize the first superconducting layer. After forming the dielectric layer, a second superconducting layer (second electrode) may be formed over the dielectric layer.

BRIEF DESCRIPTION OF DRAWINGS

The accompanying drawings may illustrate examples of concepts, embodiments, or results. They do not define or limit the scope of invention. They are not drawn to any absolute or relative scale. In some cases, identical or similar reference numbers may be used for identical or similar features in multiple drawings.

DETAILED DESCRIPTION OF EXAMPLE EMBODIMENTS

A detailed description of one or more example embodiments is provided below. To avoid unnecessarily obscuring the description, some technical material known in the related fields is not described in detail. Semiconductor fabrication generally requires many other processes before and after those described; this description omits steps that are irrelevant to, or that may be performed independently of, the described processes.

Unless the text or context clearly dictates otherwise: (1) By default, singular articles "a," "an," and "the" (or the absence of an article) may encompass plural variations; for example, "a layer" may mean "one or more layers." (2) "Or" in a list of multiple items means that any, all, or any combination of less than all the items in the list may be used in the invention. (3) Where a range of values is provided, each intervening value is encompassed within the invention. (4) "About" or "approximately" contemplates up to 10% variation. "Substantially" contemplates up to 5% variation. When the word "or" is used in reference to a list of two or more items, that word covers all of the following interpretations of the word: any of the items in the list, all of the items in the list and any combination of the items in the list.

"Above," "below," "bottom," "top," "side" (e.g. sidewall), "higher," "lower," "upper," "over," and "under" are defined with respect to the plane of the substrate. "On" indicates direct contact; "above" and "over" allow for intervening elements. "On" and "over" include conformal configurations covering feature walls oriented in any direction.

As used herein: "Adsorb" may include chemisorption, physisorption, electrostatic or magnetic attraction, or any other interaction resulting in part of the precursor adhering to the substrate surface. An "oxide of an element" may include additional components besides the element and oxygen, including but not limited to a dopant or alloy. "Film" and "layer" are synonyms representing a portion of a stack, and may mean either a single layer or a portion of a stack with multiple sub-layers (e.g., a nanolaminate). "Conformal" shall mean at least 65% conformal. As used herein, "controlled atmosphere" and "controlled environment" are equivalent and refer to a vacuum or inert-gas environment. Examples of inert gases include noble gases (helium, neon, argon, krypton, xenon) and, unless the text or context excludes it (e.g., by describing nitride formation as undesirable), nitrogen.

Figure 1A:
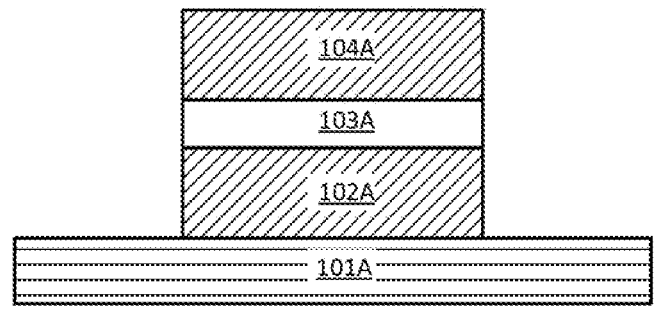
FIGS. 1A-1B conceptually illustrate some configurations of layers of an STJ.
Figure 1B:
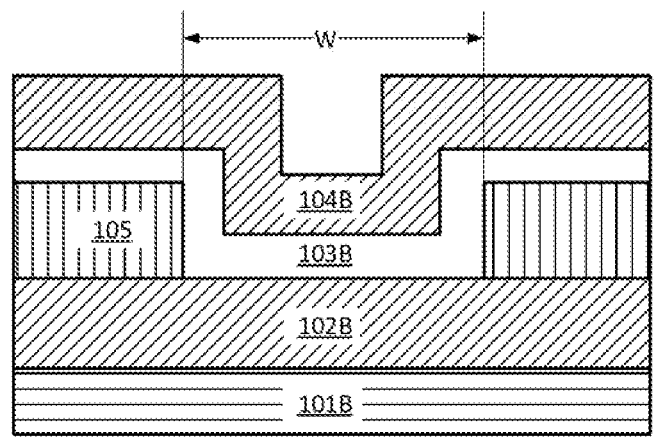

FIGS. 1A-1B conceptually illustrate some configurations of layers of an STJ. Each of the substrates 101A and 101B may include underlying layers and structures. In FIG. 1A, the STJ is formed by the "tri-layer" method. A first superconducting electrode layer 102A, a tunnel barrier layer 103A, and a second superconducting electrode layer 104A form a pillar. The pillar may be formed, for example, by depositing blanket layers of the STJ materials (materials are discussed in detail near the end of this Description) and patterning (e.g., etching) them into one or more pillar shapes.

In FIG. 1B, the STJ is formed by the "window-junction" method. A spacer dielectric 105 separates first superconducting electrode layer 102B from tunnel barrier layer 103B except within an opening (the "window" of width W), that is etched or otherwise formed in spacer dielectric 105. Tunnel barrier layer 103B is formed to contact first superconducting electrode layer 102B within the window; then a second superconducting electrode layer 104B is formed over tunnel barrier layer 103B. Sidewall coverage within the window may not be critical because the spacer dielectric 105 outside the tunnel barrier sidewalls is not likely to be a source or sink of leakage current.

ALD, which deposits one self-limiting surface monolayer at a time, offers very precise control of thickness, composition, and defect density as well as uniformity across a substrate and conformal step coverage of 3D structures. With those qualities, ALD would seem to be a highly suitable technique for forming tunnel barriers of STJs. In practice, however, parasitic oxidation of the underlying and overlying superconducting electrodes frequently occurs. The parasitic oxidation creates interface roughness that can interfere with the quantum coherence of the Cooper pairs. The parasitic oxidation also effectively increases the thickness of the tunnel barrier in an uncontrollable way, potentially creating a composite barrier too thick for the Cooper pairs to tunnel through. Because the thickness increase is uncontrollable, it may vary from one area of the substrate to another, causing non-uniformity of the critical current and critical current density between the individual STJs.

Typical oxidants used in ALD of metal oxides include water ($H_2O$), hydrogen peroxide ($H_2O_2$), ozone ($O_3$), and sometimes molecular oxygen ($O_2$). The most common process is to expose the substrate to a "pulse" (a time-limited inflow into the chamber) of the metal precursor, purge the chamber, expose the substrate to a pulse of the oxidant, purge the chamber, and repeat the alternating pulses and purges until a layer of the desired thickness (e.g., 0.7-1.5 nm) is deposited.

Upon entering the chamber, the oxygen in these oxidants is not bound to any metal. Until the oxygen encounters the metal from the metal precursor that has been deposited on the substrate surface, it does not form the intended metal oxide. In the interim, it is free to react with anything else it may encounter. A single monolayer of deposited metal from the precursor, or in some cases even a few monolayers of metal oxide, may not be sufficient to prevent the free oxidants from reaching and parasitically oxidizing the underlying electrode.

Additionally, while the tunnel barrier is being formed, some oxygen may be trapped without forming a strong bond with the precursor metal. This oxygen may later become mobile (e.g., if the substrate is annealed in a later process) and parasitically oxidize either the underlying electrode or the overlying electrode.

However, if the oxygen enters the chamber already bonded to the metal of the intended STJ metal oxide, its opportunities for unwanted reactions can be constrained. In metal alkoxide precursors of the form $M(OR)_a$ (where M is a metal, a is the valency of the metal, and R is an alkyl group), the oxygen is directly and strongly bonded to the metal. Halogens or methyl groups can react with the alkyl groups and detach them from the metal and oxygen. For example, with a metal halide precursor $MX_a$, where X is a halogen, $M(OR)_a + MX_a = 2MO_{a/2} + aRX$. Throughout the reaction, the oxygen remains bound to the metal.

Therefore, if the initial ALD pulse deposits a metal alkoxide and the second pulse deposits a metal bound to an alkyl-reactive ligand (e.g., a halide or a methyl group) that removes the alkyl group from the metal alkoxide, a metal oxide may be formed in a way that provides no free oxygen to parasitically oxidize either of the electrodes.

Figure 2A:
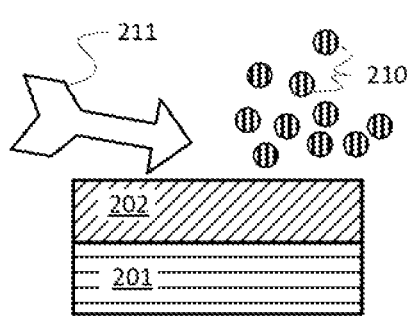
FIGS. 2A-2D conceptually illustrate ALD formation of an STJ tunnel barrier with a metal-bound oxidant.

FIGS. 2A-2D conceptually illustrate ALD formation of an STJ tunnel barrier with a metal-bound oxidant. In FIG. 2A, first superconducting layer 202 is formed on substrate 201 (which may have underlying layers and/or structures) and substrate 201 is placed in a process chamber. The exposed top surface of first superconducting layer 202 may be a blanket surface over the entire substrate, or may be a region exposed at the bottom of a window in a spacer dielectric as shown in FIG. 1B. One or more pre-treating agents, symbolized by arrow 211, removes etch residues, native oxides, or any other contaminants 210 from the exposed top surface of first superconducting layer 202. Afterward, the chamber may be purged.

Figure 2B:
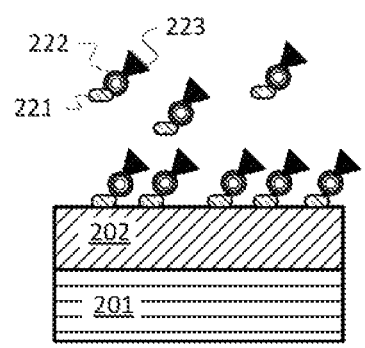

In FIG. 2B, a metal alkoxide precursor is pulsed into the chamber. For simplicity, the metal alkoxide precursor is shown with one metal atom 221, one oxygen atom 222, and one alkyl group 223, but in some embodiments there may be more than one of each for instance, if there is one metal atom, the number of alkyl groups may equal the metal's valency. The metal may or may not be the same as a metal in one of both of the superconducting electrodes. The process temperature is below the self-dissociation temperature of the metal alkoxide precursor, so the precursor largely adsorbs to the surface of first superconducting layer 202 without dissociating. In particular, the metal and oxygen remain bonded. After the pulse, the chamber may be purged.

Figure 2C:
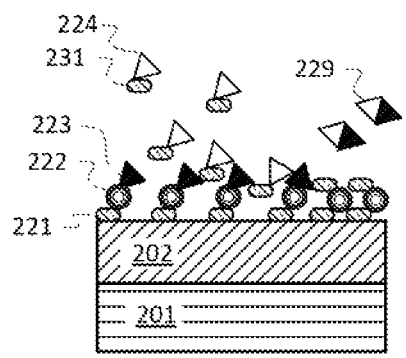

In FIG. 2C, an oxygen-free metal precursor with an alkyl-reactive ligand is pulsed into the chamber. For simplicity, the oxygen-free metal precursor is shown with one metal atom 231 and one alkyl-reactive ligand 224, but in some embodiments the number of alkyl-reactive ligands for each metal atom may equal the metal's valency. The alkyl-reactive ligand may be, for example, a halogen or a methyl group, but any ligand that bonds to alkyl groups may be used. The metal 231 may be the same metal as metal 221, or it may be a different metal.

When the oxygen-free metal precursor encounters the deposited metal alkoxide, it is believed that the oxygen 222 from the alkoxide is coordinated to the metal center 231 of the oxygen-free metal precursor and the alkyl group 223 is nucleophilically cleaved away from the oxygen 222. Without being bound by any particular theory, the result is that alkyl group 223 reacts with alkyl-reactive ligand 224, detaches from the alkoxide (in some embodiments remaining bonded to the alkyl-reactive ligand), and the former ligands 223 and 224 become by-products 229 that may readily be removed from the substrate surface (for instance, as a result of collisions with atoms or molecules of a purge gas). Throughout this reaction, the metal and oxygen deposited from the metal alkoxide precursor remain bonded. After the pulse, the chamber may be purged.

Figure 2D:
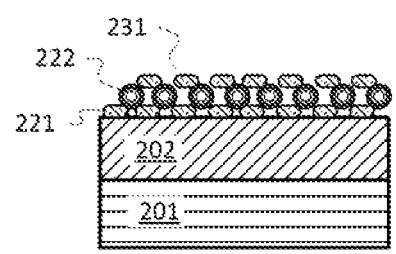

In FIG. 2D, the first monolayer of the tunnel-barrier layer is formed from metal 221, metal 231, and oxygen 222 that is still bonded at least to metal 221 and possibly coordinated to metal 231. The arrangement of the atoms is meant to be symbolic rather than to realistically reflect the structure of any particular metal oxide. Because the oxygen 222 remained bonded to metal 221 throughout the process, superconducting electrode 202 is not parasitically oxidized. The alternating pulses and purges of the metal alkoxide precursor and the oxygen-free metal precursor with the alkyl-reactive ligand may now be repeated to form more monolayers until the desired thickness of the tunnel barrier layer is formed.

Figure 3:
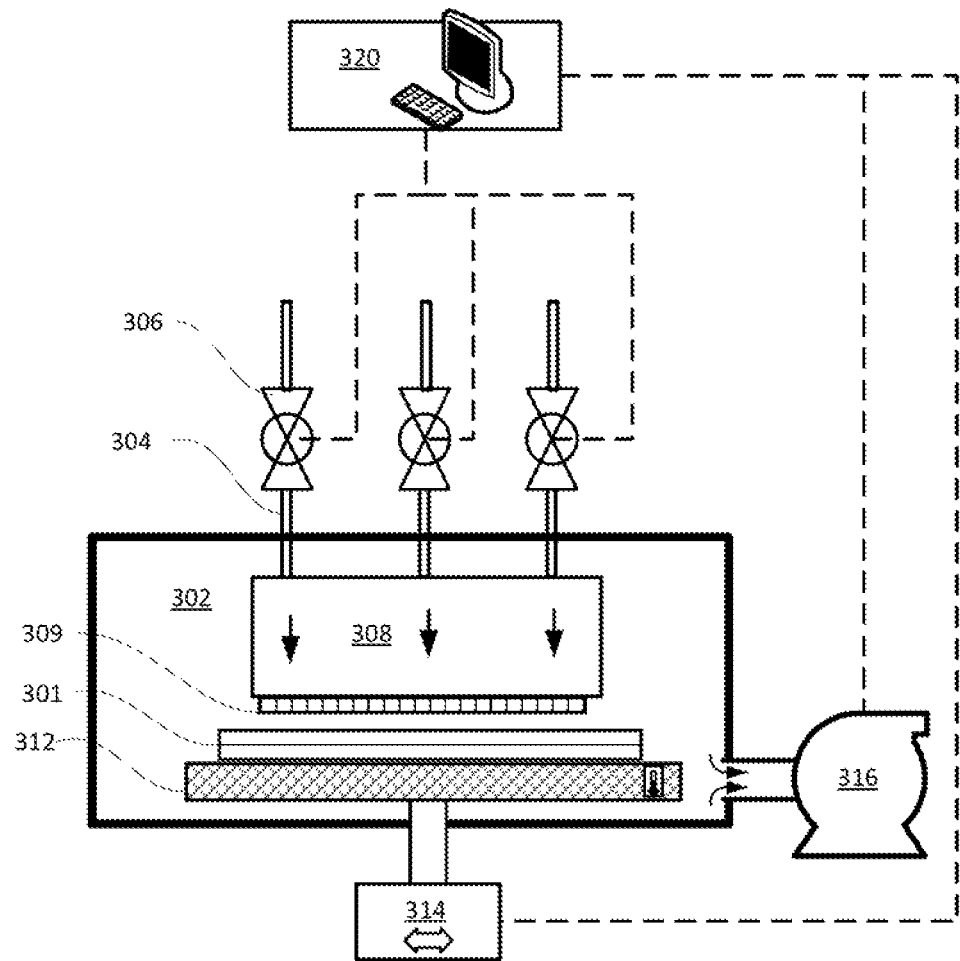
FIG. 3 is a block diagram of an example ALD apparatus.

FIG. 3 is a block diagram of an example ALD apparatus. For clarity, some components that may be included with some ALD chambers, such as a substrate-loading port, substrate lift pins, and electrical feedthroughs, are not shown. Environmentally-controlled process chamber 302 contains substrate holder 312 to hold substrate 301 for processing. Substrate holder 312 may be made from a thermally conducting metal (e.g., tungsten, molybdenum, aluminum, nickel) or other like materials (e.g., a conductive ceramic) and may be temperature-controlled. Drive 314 may move substrate holder 312 (e.g., translate or rotate in any direction) during loading, unloading, process set-up, or sometimes during processing.

Process chamber 302 is supplied with process gases by gas delivery lines 304 (although three are illustrated, any number of delivery lines may be used). A valve and/or mass flow controller 306 may be connected to one or more of delivery lines 304 to control the delivery rates of process gases into process chamber 302. In some embodiments, gases are routed from delivery lines 304 into process chamber 302 through delivery port 308. Delivery port 308 may be configured to premix the process gases (e.g., precursors and diluents), shape the distribution of the process gases over the surface of substrate 301, or both. Delivery port 308, sometimes called a "showerhead," may include a diffusion plate 309 that distributes the process gases through multiple holes. Vacuum pump 316 exhausts reaction products and unreacted gases from, and maintains the desired ambient pressure in, process chamber 302.

Controller 320 may be connected to control various components of the apparatus to produce a desired set of process conditions. Controller 320 may include one or more memory devices and one or more processors with a central processing unit (CPU) or computer, analog and/or digital input/output connections, stepper motor controller boards, and the like. In some embodiments, controller 320 executes system control software including sets of instructions for controlling timing, gas flows, chamber pressure, chamber temperature, substrate temperature, radio frequency (RF) power levels (if RF components are used, e.g., for process gas dissociation), and other parameters. Other computer programs and instruction stored on memory devices associated with controller 320 may be employed in some embodiments.

Figure 4:
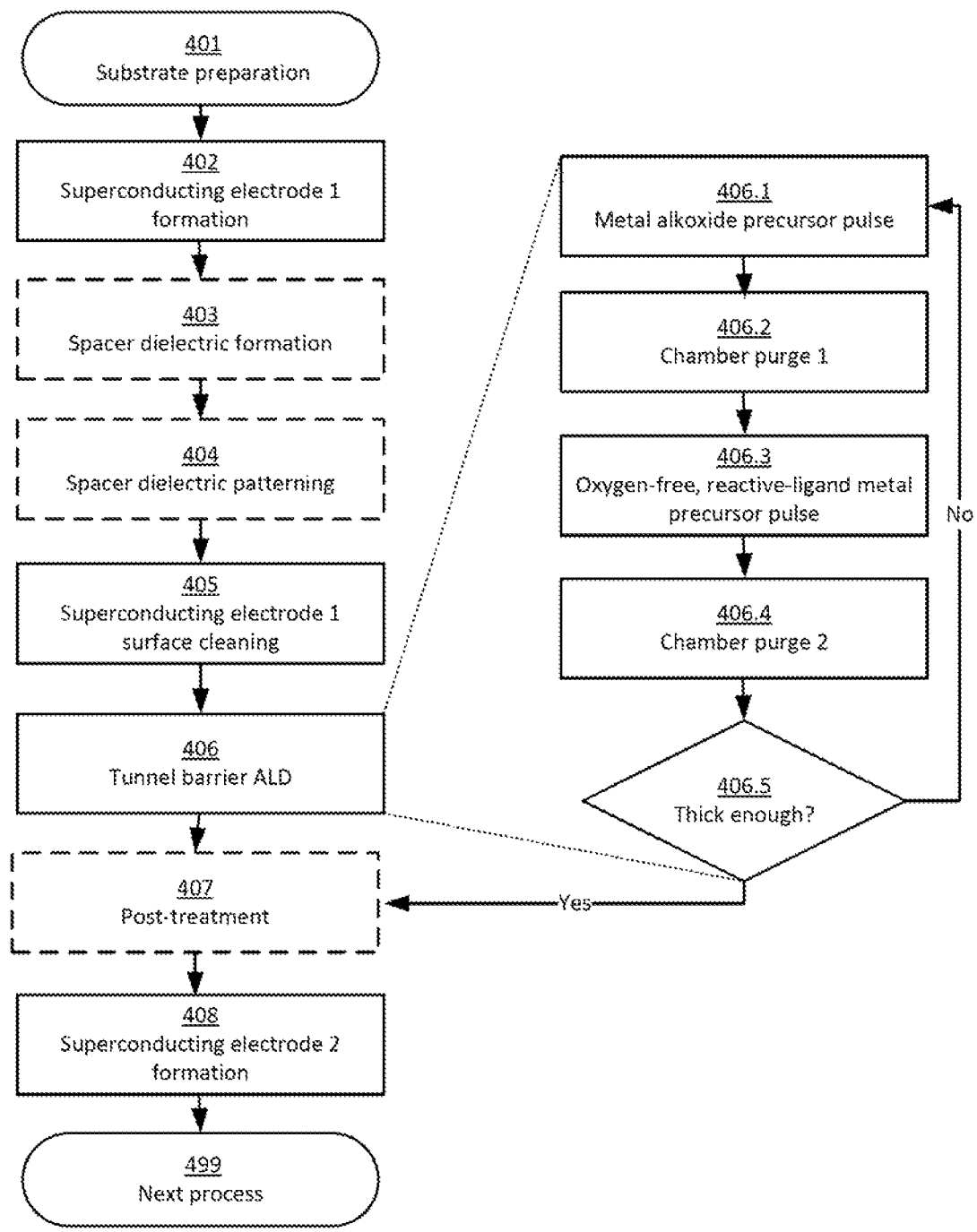
FIG. 4 is a flowchart of an example process for forming layers of an STJ.

FIG. 4 is a flowchart of an example process for forming layers of an STJ. Substrate preparation 401 may include cleaning, degassing, and/or formation of underlying interconnects and other layers or structures. Formation 402 of the first superconducting electrode layer may be done by ALD, electrochemical deposition, chemical vapor deposition (CVD), physical vapor deposition (PVD), plasma-enhanced variations, or any other suitable method, depending on the materials and dimensions required. In some embodiments, formation 402 may include patterning. In some embodiments, such as window-junction fabrication methods, spacer dielectric formation 403 and spacer dielectric patterning 404 may follow first superconducting electrode layer formation 402, but in some embodiments, such as tri-layer fabrication, they may be omitted.

The cleaning 405 of the exposed surface of the first superconducting electrode layer may include Ar sputtering, wet cleaning, or reduction of unwanted oxides by H* radicals or other plasma-generated species. A purge of the chamber may be included as a final step of cleaning 405. In some embodiments, the substrate is not exposed to an uncontrolled ambient atmosphere between cleaning 405 and tunnel barrier ALD 406. For example, the two treatments may be done in suitably equipped chambers sharing a controlled environment, or in the same chamber.

The tunnel barrier ALD 406 includes one or more cycles. Each cycle includes a metal alkoxide precursor pulse 406.1, a first purge 406.2, a pulse 406.3 of an oxygen-free metal precursor having an alkyl-reactive ligand, and a second purge 406.4. The cycles continue until the tunnel barrier reaches a desired thickness (e.g., 0.7-1.5 nm or in some cases up to 3 nm). The metal oxide may include only one metal, or it may include more than one. The metal may or may not be a metal included in one or both of the superconducting electrodes.

Optionally, a post-treatment 407 may follow the tunnel barrier ALD 406. Post-treatment 407 may densify the tunnel barrier or remove defects. For example, post-treatment 407 may include UV irradiation (e.g., 220-350 nm light), low-energy plasma treatment (e.g., <300 W), or a rapid anneal for up to 30 s at a temperature of up to 950° C. In some embodiments, post-treatment 407 may include patterning.

After tunnel barrier ALD 406, or after optional post-treatment 407 if it is done, is the formation 408 of the second superconducting electrode layer. Method similar to those used for the first superconducting electrode layer, or other methods suites to the materials and dimensions of the second superconducting electrode layer, may be used. In some embodiments, formation 408 may include patterning.

Materials for the electrodes may be any superconducting material that may be formed as a thin film on a substrate, such as aluminum (Al), niobium (Nb), Nb alloys, Nb nitride, ceramic superconductors, or organic superconductors.

The metals in the metal oxides may include, without limitation, aluminum (Al), antimony (Sb), germanium (Ge), hafnium (Hf), lanthanum (La), niobium (Nb), silicon (Si), tantalum (Ta), tin (Sn), thallium (Tl), (titanium (Ti), vanadium (V), or zirconium (Zr). The same metal may be in both the metal alkoxide precursor and the oxygen-free metal precursor with the alkyl-reactive ligand, or the metals may be different. Metal alkoxide precursors include, without limitation, metal ethoxides $(M(OEt)_a)$, metal isopropoxides $(M(O^iPr)_a)$, metal n-butoxides $(M(O^nBu)_a)$, and metal t-butoxides $(M(O^tBu)_a)$, where M is the metal and a is the metal's valency (e.g., 3 for Al; 4 for Hf, Si, Ti, Zr; 5 for Ta). For example, the metal alkoxide may include aluminum isopropoxide, dimethylaluminum i-propoxide, zirconium(IV) t-butoxide, titanium(IV) i-propoxide, titanium(IV) n-butoxide, niobium(V) ethoxide, tantalum(V) ethoxide.

Oxygen-free metal precursors with alkyl-reactive ligands include metal halides $MX_a$ (X=F, Cl, Br, or I; e.g., $TiCl_4$) and (a)-methyl metals $M(Me)_a$ (e.g., trimethyl aluminum "TMA"), where M is the metal and a is the metal's valency.

Pulse and purge times for the precursor may range from about 1-30 s. Flow rates may be about 100 sccm for precursors and about 500 sccm for carrier gases (e.g., Ar). Chamber pressure during the ALD of the tunnel barrier may be between 100 mTorr and 1 Torr. Finished tunnel barrier layer thicknesses may be below 3 nm., e.g., 0.7-1.5 nm.

Process temperatures for the tunnel-barrier ALD may be in the range of 100-400° C. Generally, higher temperatures promote the reaction between the metal alkoxide and the alkyl-reactive ligand, but an upper temperature limit may be determined by the self-decomposition temperature of the metal alkoxide precursor. Self-decomposition is undesired because it may result in free oxygen that may parasitically oxidize the electrode. Optionally, formation of the tunnel barrier layer may be followed by annealing at temperatures up to 950° C. for 15-45 seconds.

Although the foregoing examples have been described in some detail to aid understanding, the invention is not limited to the details in the description and drawings. The examples are illustrative, not restrictive. There are many alternative ways of implementing the invention. Various aspects or components of the described embodiments may be used singly or in any combination. The scope is limited only by the claims, which encompass numerous alternatives, modifications, and equivalents.

What is claimed is:

1. A method comprising:
   forming a first superconducting layer on a substrate;
   exposing a surface of the first superconducting layer to a first precursor; and
   exposing the surface of the first superconducting layer to a second precursor;
   wherein the first precursor comprises a metal alkoxide selected from the group consisting of zirconium(IV) t-butoxide and titanium(IV) n-butoxide;
   wherein the first superconducting layer comprises a metal selected such that the metal remains unoxidized by the metal alkoxide when the surface of the first superconducting layer is exposed to the second precursor;
   wherein the second precursor comprises an oxygen-free metal precursor having an alkyl-reactive ligand; and
   wherein the first precursor and the second precursor react to form a monolayer of metal oxide over the surface of the first superconducting layer.

2. The method of claim 1, further comprising cleaning the surface of the first superconducting layer before the exposing the surface to the first precursor.

3. The method of claim 2, wherein the cleaning comprises at least one of argon sputtering, wet cleaning, or exposure to plasma species.

4. The method of claim 2, wherein the substrate is kept in a controlled environment between the cleaning and the exposing to the first precursor.

5. The method of claim 1, wherein the exposing the surface of the first superconducting layer to the first precursor comprises injecting the first precursor for between about 1 and 30 seconds into a process chamber containing the substrate, followed by purging the process chamber for between about 1 and 30 seconds.

6. The method of claim 1, wherein the exposing the surface of the first superconducting layer to the second precursor comprises injecting the second precursor for between about 1 and 30 seconds into a process chamber containing the substrate, followed by purging the process chamber for between about 1 and 30 seconds.

7. The method of claim 1, wherein the first superconducting layer is exposed to the first precursor at a temperature between 100° C. and a temperature at which the first precursor decomposes.

8. The method of claim 1, wherein an alkyl of the metal alkoxide and the alkyl-reactive ligand combine to form a by-product when the first precursor and the second precursor react to form the monolayer of metal oxide.

9. The method of claim 1, further comprising repeating the exposing to the first precursor and the exposing to the second precursor, wherein the repeating forms additional monolayers of metal oxide to a thickness between about 0.7 nm and 3 nm over the surface of the first superconducting layer.

10. The method of claim 1, further comprising plasma-treating, UV-irradiating, or annealing the metal oxide.

11. The method of claim 10, wherein the annealing is performed at a temperature less than or equal to 950° C. for between about 1 second and 30 seconds.

12. The method of claim 1, further comprising forming a second superconducting layer over the metal oxide; wherein the first and second superconducting layers are operable as electrodes of a superconducting tunnel junction; and wherein the metal oxide is operable as a tunnel barrier layer of the superconducting tunnel junction.

13. The method of claim 12, further comprising patterning at least one of the first superconducting layer, the metal oxide, or the second superconducting layer.

14. The method of claim 12, wherein the first superconducting layer or the second superconducting layer comprises a same metal as the metal oxide.

15. The method of claim 1, further comprising forming a dielectric layer over the first superconducting layer, and forming an opening in the dielectric layer to expose part of the surface of the first superconducting layer, before exposing the surface of the first superconducting layer to the first precursor.

16. The method of claim 1, wherein the first superconducting layer comprises aluminum, niobium, a superconducting ceramic, or an organic superconductor.

17. The method of claim 1, wherein the alkyl-reactive ligand comprises at least one of a halogen or a methyl group; and wherein the second precursor comprises aluminum (Al), antimony (Sb), germanium (Ge), hafnium (Hf), lanthanum (La), niobium (Nb), silicon (Si), tantalum (Ta), tin (Sn), thallium (Tl), titanium (Ti), vanadium (V), or zirconium (Zr).

18. The method of claim 1, wherein the first precursor and the second precursor comprise a same metal.

19. The method of claim 1, wherein the metal of the first superconducting layer is same as a metal of the metal alkoxide.

20. The method of claim 1, wherein the alkyl-reactive ligand is a methyl group.

* * * * *